United States Patent
Jang

(10) Patent No.: US 7,206,876 B2
(45) Date of Patent: Apr. 17, 2007

(54) INPUT/OUTPUT INTERFACE OF AN INTEGRATED CIRCUIT DEVICE

(75) Inventor: Seong-jin Jang, Seongnam (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 496 days.

(21) Appl. No.: 10/734,636

(22) Filed: Dec. 15, 2003

(65) Prior Publication Data

US 2004/0207430 A1 Oct. 21, 2004

(51) Int. Cl.
*G06F 13/30* (2006.01)
*H03K 19/00* (2006.01)

(52) U.S. Cl. .......................... 710/66; 326/66; 365/168

(58) Field of Classification Search ............ 326/60–66; 360/40; 365/168, 189; 710/66
See application file for complete search history.

(56) References Cited

U.S. PATENT DOCUMENTS

| | | | | |
|---|---|---|---|---|
| 3,274,611 A | * | 9/1966 | Brown et al. ............... | 360/40 |
| 4,482,927 A | * | 11/1984 | Melbye et al. ............... | 360/40 |
| 4,506,252 A | * | 3/1985 | Jacoby et al. ............... | 341/57 |
| 4,972,106 A | * | 11/1990 | Ruijs ........................... | 326/60 |
| 5,045,728 A | * | 9/1991 | Crafts ......................... | 326/60 |
| 5,287,305 A | * | 2/1994 | Yoshida ................. | 365/189.01 |
| 5,398,327 A | * | 3/1995 | Yoshida ....................... | 710/66 |
| 5,432,735 A | * | 7/1995 | Parks et al. ................. | 365/168 |
| 5,498,980 A | * | 3/1996 | Bowles ........................ | 326/60 |
| 5,764,571 A | | 6/1998 | Banks | |
| 5,896,337 A | | 4/1999 | Derner | |
| 5,912,563 A | * | 6/1999 | Garnett ........................ | 326/60 |
| 6,324,602 B1 | | 11/2001 | Chen et al. | |
| 6,339,622 B1 | * | 1/2002 | Kim ............................ | 375/287 |

\* cited by examiner

*Primary Examiner*—Christopher Shin
(74) *Attorney, Agent, or Firm*—Volentine & Whitt, PLLC

(57) ABSTRACT

An integrated circuit includes M first terminals and N second terminals, where M and N are positive integers, and where M>N>1. The circuit further includes a converter which receives M base-A-level input signals from the M first terminals, respectively, encodes each of $A^M$ values represented by the M base-A-level input signals as a different base-K value represented by N base-K-level output signals, A and K are positive integers, and where K>A>1. The converter then outputs the N base-K-level output signals to the N second terminals, respectively.

41 Claims, 12 Drawing Sheets

| DATA-OUT | | | OUTPUT of ENCODER | | | | DATA | |
|---|---|---|---|---|---|---|---|---|
| D1 | D2 | D3 | DO1 | DO2 | DO3 | DO4 | DQ1 | DQ2 |
| 0 | 0 | 0 | 1 | 1 | 1 | 1 | 0 | 0 |
| 0 | 0 | 1 | 1 | 1 | 0 | 1 | 0 | M |
| 0 | 1 | 0 | 0 | 1 | 0 | 1 | M | M |
| 0 | 1 | 1 | 0 | 1 | 0 | 0 | M | 1 |
| 1 | 0 | 0 | 0 | 1 | 1 | 1 | M | 0 |
| 1 | 0 | 1 | 0 | 0 | 1 | 1 | 1 | 0 |
| 1 | 1 | 0 | 0 | 0 | 0 | 1 | 1 | M |
| 1 | 1 | 1 | 0 | 0 | 0 | 0 | 1 | 1 |

FIG. 11

| DATA | | OUTPUT of INPUT BUFFER | | | | DATA-IN | | |
|---|---|---|---|---|---|---|---|---|
| DQ1 | DQ2 | DI1 | DI2 | DI3 | DI4 | D1 | D2 | D3 |
| 0 | 0 | 0 | 0 | 0 | 0 | 0 | 0 | 0 |
| 0 | M | 0 | 0 | 0 | 1 | 0 | 0 | 1 |
| M | 1 | 0 | 1 | 0 | 1 | 0 | 1 | 0 |
| M | 1 | 0 | 1 | 1 | 1 | 0 | 1 | 1 |
| M | 0 | 0 | 1 | 0 | 0 | 1 | 0 | 0 |
| 1 | 0 | 1 | 1 | 0 | 0 | 1 | 0 | 1 |
| 1 | M | 1 | 1 | 0 | 1 | 1 | 1 | 0 |
| 1 | 1 | 1 | 1 | 1 | 1 | 1 | 1 | 1 |

FIG. 12

INPUT/OUTPUT INTERFACE OF AN INTEGRATED CIRCUIT DEVICE

BACKGROUND OF THE INVENTION

1. Field of the Invention

The present invention generally relates to integrated circuit devices, and more particularly, the present invention relates to the input/output (I/O) interface of an integrated circuit device.

2. Description of the Related Art

It is generally desirable to increase the data transfer bandwidth at the input/output (I/O) interface of integrated circuit (IC) devices. Unfortunately, however, any increase in transfer bandwidth is accompanied by an increase in the number of data pins of the IC device. A large number of data pins disadvantageously occupy a large device area, and also increase power consumption and power related noise.

FIG. 1 is a block diagram of a conventional memory circuit. Address signals ADDR1–ADDRi are temporarily stored by an address buffer 10, and a clock signal CLK and external command signals /CS, /RAS, /CAS and /WE are applied to a command decoder 20. At a timing of the clock signal CLK, the command decoder decodes the external command signals into internal command signals PR, PC, PREAD, and PWRITE. In response to the internal command PR, the row decoder 30 selects one or more rows of a memory cell array 50 according to an address stored in the address buffer 10. Likewise, in response to the internal command PC, the column decoder 40 selects one or more columns of the memory cell array 50 according to the address stored in the address buffer 10. Whether data is written into or read from the memory cell array 50 is controlled by the internal commands PWRITE and PREAD, respectively. Data read from the memory cell array is passed through an I/O interface circuit 55 and applied to data pins DQ1 through DQn, and data written into the memory cell array 50 is received from the data pins DQ1 through DQn via the I/O interface circuit 55.

FIG. 2 is a detailed block diagram of the interface circuit 55 shown in FIG. 1. In the case of a read operation, a first bit DATA1 of the n-bit parallel output data is temporarily stored in an output buffer 55-1 and then applied to the data pin DQ1. Similarly, second and third bits DATA2 and DATA 3 of the n-bit parallel output data are temporarily stored in output buffers 55-3 and 55-5, and then applied to the data pins DQ2 and DQ3, respectively. The remaining bits of the parallel output data are likewise temporarily stored in respective n−3 buffers (not shown) and then applied to data pins DQ4 through DQn of FIG. 1.

In the case of a write operation, a first bit of the n-bit parallel input data at data pin DQ1 is temporarily stored in an input buffer 55-2 and then applied as DATA1 to the memory cell array. Likewise, second and third bits of the n-bit parallel input data at the data pins DQ2 and DQ3 are temporarily stored in input buffers 55-4 and 55-6 and then applied as DATA2 and DATA 3 to the memory cell array. The remaining bits of the parallel input data at data pins DQ4 through DQn of FIG. 1 are also temporarily stored in respective n−3 input buffers (not shown) and then applied to the memory cell array.

The data DATA1, DATA2, etc. are deemed to be logically high (H) or low (L) depending on the voltage level thereof. FIG. 3 is a diagram for explaining the two-level signaling scheme of the conventional I/O interface circuit. If the voltage level of the input data is greater than a reference voltage REF, then the input data is deemed to be logically high (VIH), and if the voltage level of the output data is greater than the reference voltage REF, then the output data is also deemed to be logically high (VOH). On the other hand, if the voltage level of the input data is less than the reference voltage REF, then the input data is deemed to be logically low (VIL), and if the voltage level of the output data is less than the reference voltage REF, then the output data is also deemed to be logically low (VOL).

In the conventional device described above, the number of data pins DQ1 through DQn is equal to the number of bits of the parallel input/output data read from and written into the memory cell array. Thus, any increase in the number of bits of the data transfer rate of the I/O interface will result the need to additionally equip the device with an equal number of data pins. As suggested previously, any addition in the number of data pins disadvantageously occupies more device area, and also increases power consumption and power-related noise.

SUMMARY OF THE INVENTION

According to a first aspect of the invention, an integrated circuit is provided which includes M first terminals and N second terminals, where M and N are positive integers, and where M>N>1; a converter which receives M base-A-level input signals from the M first terminals, respectively, which encodes each of $A^M$ values represented by the M base-A-level input signals as a different base-K value represented by N base-K-level output signals, and which outputs the N base-K-level output signals to the N second terminals, respectively, where A and K are positive integers, and where K>A>1.

According to another aspect of the invention, an integrated circuit is provided which includes N first terminals and M second terminals, where M and N are positive integers, and where M>N>1; a converter which receives N base-K-level input signals from the N first terminals, respectively, which decodes each base-K value represented by the N base-K-level input signals into a different one of $A^M$ values of M base-A-level output signals, and which outputs the M base-A-level output signals to the M second terminals, respectively, where A and K are positive integers, and where K>A>1.

According to still another aspect of the present invention, an integrated circuit is provided which includes M first terminals and N second terminals, where M and N are positive integers, and where M>N>1; a first converter which receives M base-A-level output signals from the M first terminals, respectively, which encodes each of $A^M$ values of the M base-A-level output signals into a different base-K value represented by N base-K-level output signals, and which outputs the N base-K-level output signals to the N second terminals, respectively, where A and K are positive integers, and where K>A>1; and a second converter which receives N base-K-level input signals from the N first terminals, respectively, which decodes each base-K value represented by the N base-K-level input signals into a different one of $A^M$ values of M base-A-level input signals, and which outputs the M base-A-level input signals to the M second terminals, respectively.

According to yet another aspect of the present invention, an integrated circuit is provided which includes a memory device including an memory cell array, an address decoder and a command decoder; a plurality of pin terminals; and an interface circuit operatively coupled between the memory device and the plurality of pin terminals, said interface circuit comprising (a) a first converter which receives three binary-level output signals from three respective signal lines of the memory device, which encodes each of eight values represented by the three binary-level output signals into a ternary value represented by two ternary-level output signals, and which outputs the two ternary-level output signals to two of said plurality of pin terminals, respectively, and (b) a second converter which receives two ternary-level input signals from said two pin terminals, respectively, which decodes each ternary value represented by the two ternary-level input signals into a different one of eight values represented by three binary-level input signals, and which outputs the three binary-level input signals to said three signal lines of the memory device, respectively.

According to another aspect of the present invention, method is provided for interfacing an internal circuit of an integrated circuit device with output terminals of the integrated circuit device. The method includes receiving M base-A-level output signals from M terminals of the internal circuit, respectively, encoding each of $A^M$ values represented by the M base-A-level output signals as a different base-K value represented by N base-K-level output signals, and outputting the N base-K-level output signals to N output terminals of the integrated circuit device, respectively. Here, M, N, A and K are positive integers, M>N>1, and K>A>1.

According to still another aspect of the present invention, a method is provided for interfacing an internal circuit of an integrated circuit device with input terminals of the integrated circuit device. The method includes receiving N base-K-level input signals from N input terminals of the integrated circuit device, respectively, decoding each base-K value represented by the N base-K-level input signals into a different one of $A^M$ values of M base-A-level input signals, and outputting the M base-A-level input signals to M terminals of the internal circuit, respectively. Here, M, N, A and K are positive integers, M>N>1, and K>A>1.

According to yet another aspect of the present invention, a method is provided for interfacing an internal circuit of an integrated circuit device with input/output terminals of the integrated circuit device. The method includes first and second signal conversion processes. The first signal conversion process includes receiving M base-A-level output signals from M terminals of the internal circuit, respectively, encoding each of $A^M$ values represented by the M base-A-level output signals as a different base-K value represented by N base-K-level output signals, and outputting the N base-K-level output signals to N input/output terminals of the integrated circuit device, respectively. The second signal conversion process includes receiving N base-K-level input signals from the N input/output terminals of the integrated circuit device, respectively, decoding each base-K value represented by the N base-K-level input signals into a different one of $A^M$ values of M base-A-level input signals, and outputting the M base-A-level input signals to the M terminals of the internal circuit, respectively. Here, M, N, A and K are positive integers, M>N>1, and K>A>1.

According to another aspect of the present invention, method is provided for interfacing an internal circuit of an integrated circuit memory device with input/output pin terminals of the integrated circuit memory device. The method includes first and second signal conversion processes. The first signal conversion process includes receiving three binary-level output signals from three respective signal lines of the internal circuit, encoding a binary value represented by the three binary-level output signals into a ternary value represented by two ternary-level output signals, and outputting the two ternary-level output signals to two of input/output pin terminals, respectively. The second signal conversion process includes receiving two ternary-level input signals from the two input/output pin terminals, respectively, decoding a ternary value represented by the two ternary-level input signals into a binary value represented by three binary-level input signals, and outputting the three binary-level input signals to the three signal lines of the internal circuit, respectively.

BRIEF DESCRIPTION OF THE DRAWINGS

The features and advantages of the present invention will become readily apparent from the detailed description that follows, with reference to the accompanying drawings, in which:

FIG. 11 is a table showing the logic input and output states of the encoder and output buffer of FIG. 8; and FIG. 12 is a table showing the logic input and output states of the input buffer and decoder of FIG. 9.

DETAILED DESCRIPTION OF THE PREFERRED EMBODIMENTS

The present invention will now be described with reference to several non-limiting preferred embodiments.

Figure 4:
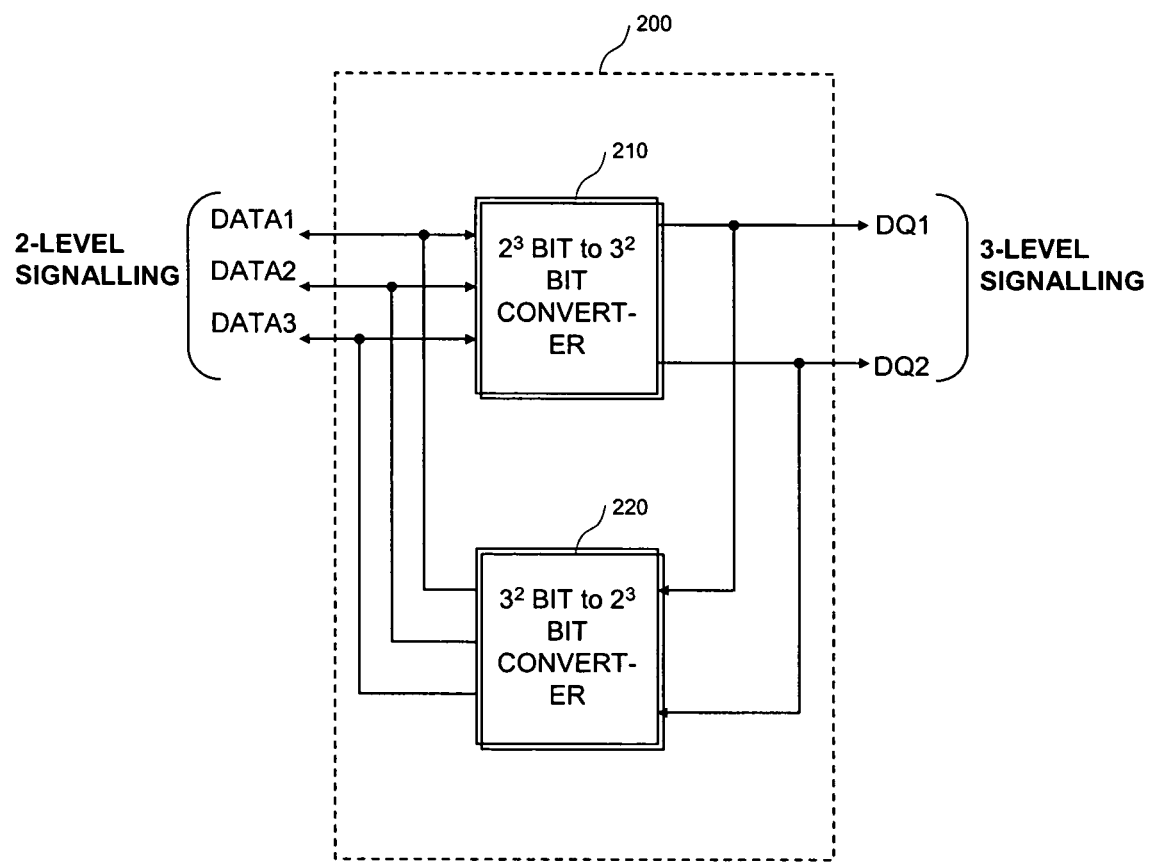
FIG. 4 is a block diagram of an I/O interface according to an embodiment of the present invention.

FIG. 4 is a block diagram of an input/output (I/O) interface according to an embodiment of the present invention. The I/O interface 200 of this embodiment includes a converter 210 which receives M base-A-level input signals (DATA1, DATA2, DATA3) from M first terminals, respectively, and encodes each of $A^M$ values represented by the M base-A-level input signals as a different base-K value represented by N base-K-level output signals. The converter 210 then outputs the N base-K-level output signals to N second terminals (DQ1, DQ2), respedtively. Here, M>N, and K>A>1, and M, N, K and A are all positive integers.

In the example of FIG. 4, M=3 and A=2, and accordingly, the data DATA1, DATA2 and DATA3 are base-2-level (binary) signals that are respectively received on three input terminals of the converter 210. Also in this example, N=2 and K=3, and accordingly, the output of the converter 210 is two base-3-level (ternary) signals applied to output terminals DQ1 and DQ2. In other words, the converter 210 of FIG. 4 is a $2^3$-bit-to-$3^2$ bit converter having three binary inputs and two ternary outputs.

The I/O interface of FIG. 4 also includes a converter 220 which receives N base-K-level input signals from N first terminals (DQ1, DQ2), respectively, and decodes each base-K value represented by the N base-K-level input signals into a different one of $A^M$ values of M base-A-level output signals (DATA1, DATA2, DATA3). The converter 220 then outputs the M base-A-level output signals to M second terminals, respectively. As before, M>N, and K>A>1, and M, N, K and A are all positive integers.

In the example of FIG. 4, N=2 and K=3, and accordingly, the input of the converter 220 is two base-3-level signals received from terminals DQ1 and DQ2. Also in this example, M=3 and A=2, and accordingly, the data DATA1, DATA2 and DATA3 are base-2-level signals that are respectively output on three terminals from the converter 210. In other words, the converter 220 of FIG. 4 is a $3^2$-bit-to-$2^3$ bit converter having two ternary inputs and three binary outputs.

Figure 3:
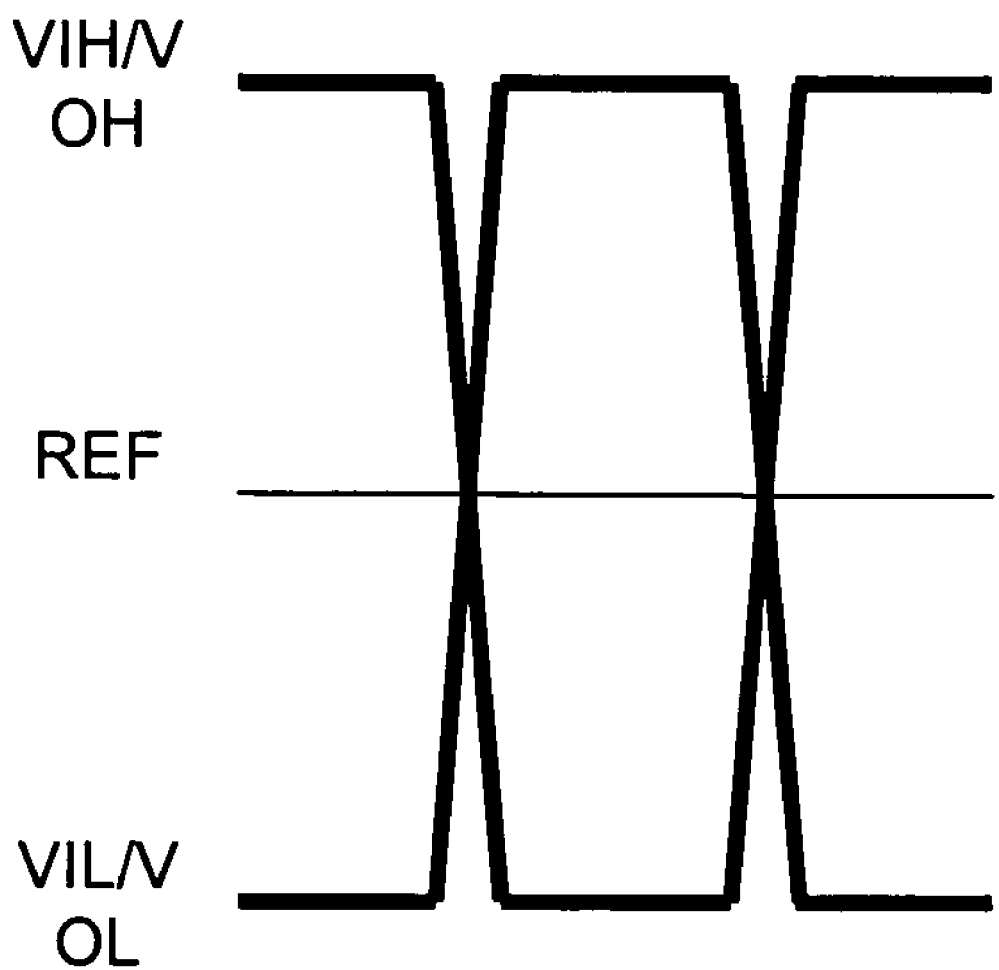
FIG. 3 is a diagram illustrating the two-level signaling scheme of the conventional I/O interface of FIG. 2.
Figure 7:
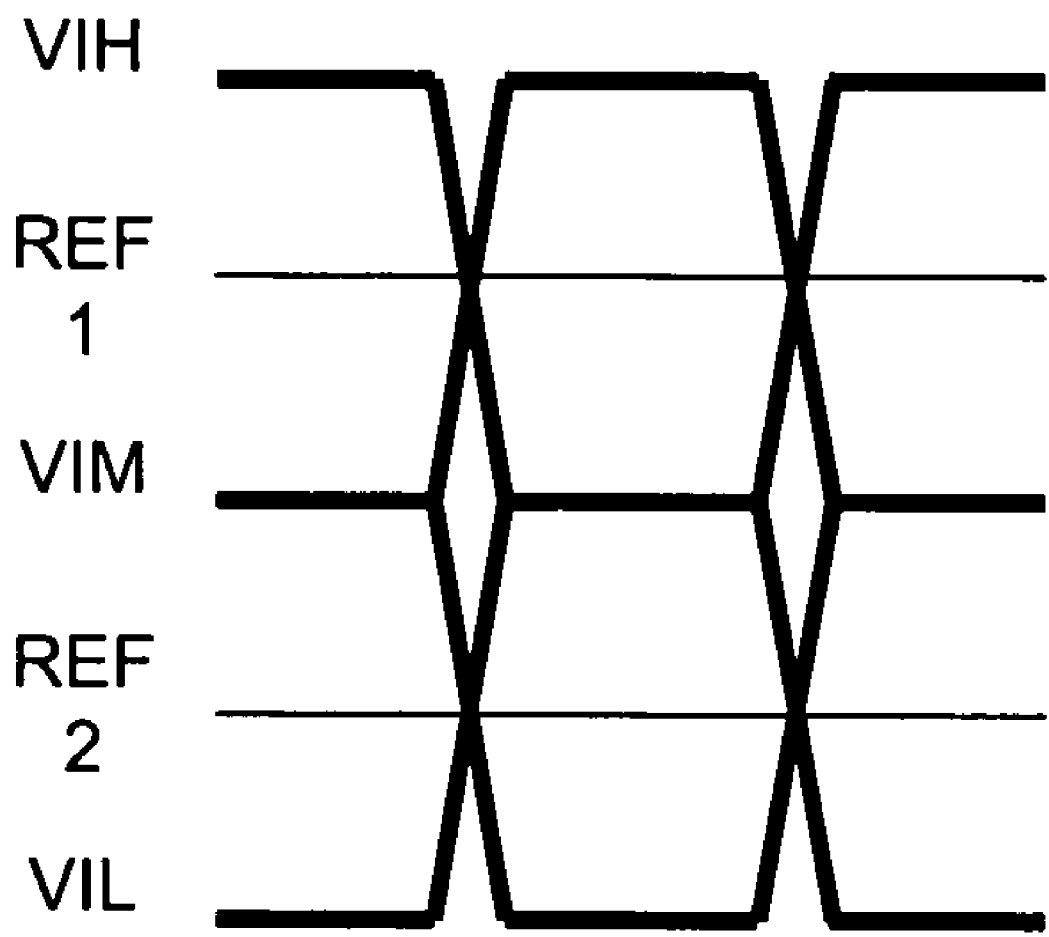
FIG. 7 is a diagram illustrating the three-level signaling scheme of an embodiment of the present invention.

The base-2-level signaling (A=2) was described previously in connection with FIG. 3. The base-3-level signaling (K=3) is shown in FIG. 7 with respect to input data (output data is discriminated in the same manner). If the voltage level of the input data is greater than a reference voltage REF1, the input data is deemed to be logically high (VIH). If the voltage level of the input data is less than the reference voltage REF1 and greater than the voltage level REF2, the input data is deemed to be logically middle (VIM). If the voltage level of the input data is less than the reference voltage REF2, the input data is deemed to be logically low (VIL). As should be readily apparent, each bit of the multi-level signaling of FIG. 7 carries more information than each bit of the base-2-level signaling of FIG. 3.

Figure 6:
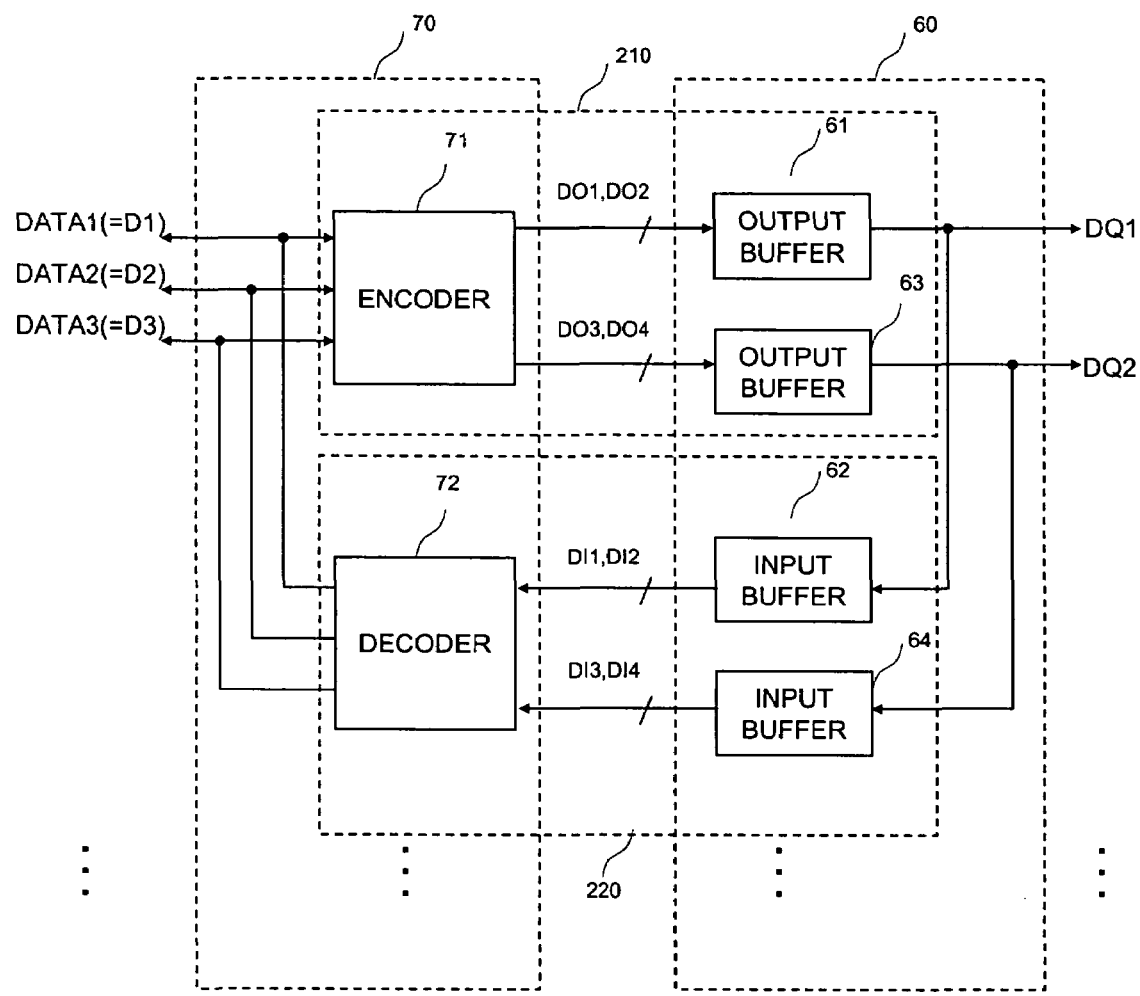
FIG. 6 is a block diagram of the bit converters of the I/O interface of FIG. 4 according to an embodiment of the present invention.

FIG. 6 illustrates a more detail example of the I/O device of FIG. 4. As shown, the I/O interface is generally made up of an encoder/decoder circuit 70 and an input/output circuit 60.

More specifically, the converter 210 of the I/O interface includes an encoder 71 which receives M base-A-level input signals and which outputs at least M+1 encoded signals, and an output buffer 61, 63 which receives the at least M+1 encoded signals and outputs N base-K-level output signals.

As before, the example of FIG. 6 shows the case where N=2, K=3, M=3 and A=2. Accordingly, the encoder 71 receives three (M) base-2-level (binary) internal data D1, D2 and D3, and encodes the received data into four (M+1) base-2-level (binary) data DO1, DO2 and DO3, DO4. The data DO1 and DO2 are applied to an output buffer 61 which converts the same into a base-3-level (ternary) signal applied to terminal DQ1. The data DO3 and DO4 are applied to an output buffer 63 which converts the same into a base-3-level (ternary) signal applied to terminal DQ2. Note here that the three base-2-level data D1, D2 and D3 can collectively have $3^2$ (=8) possible states, whereas the two base-3-level data on terminal DQ1 and DQ2 can have $2^3$ (=9) possible states. Thus, the binary data D1, D2 and D3 can be encoded as ternary data on the terminals DQ1 and DQ2.

Still referring the FIG. 6, the converter 220 of the I/O interface circuit includes an input buffer 62, 64 which receives N base-K-level input signals and which outputs at least M+1 coded signals, and an decoder 72 which receives the at least M+1 coded signals and which outputs the M base-A-level output signals.

Again, the example of FIG. 6 shows the case where N=2, K=3, M=3 and A=2. Input buffers 62 and 64 respectively receive two (N) base-3-level (ternary) input signals from terminals DQ1 and DQ2 as shown. The input buffer 62 converts the ternary input signal of terminal DQ1 into binary signals DI1 and DI2, and the input buffer 64 converts the ternary input signal of terminal DQ2 into binary signals DI3 and DI4. Thus, the two (N) ternary signals (DQ1, DQ2) are converted into four (M+1) binary signals (DI1, DI2, DI3, DI4). These four binary signals are then decoded by the decoder 72 into three (M) base-2-level signals D1, D2 and D3.

Figure 1:
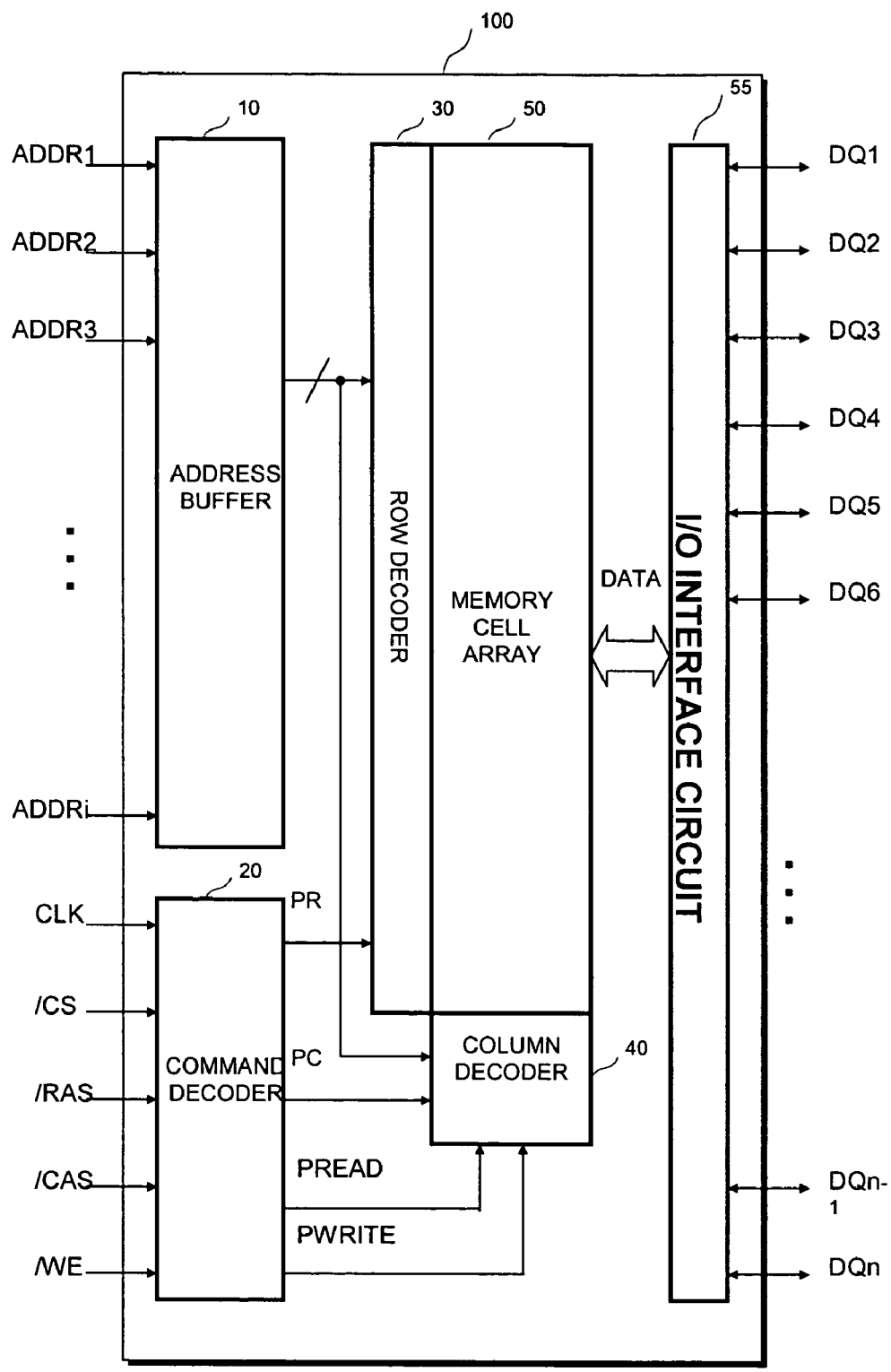
FIG. 1 is a block diagram of a conventional memory device.
Figure 2:
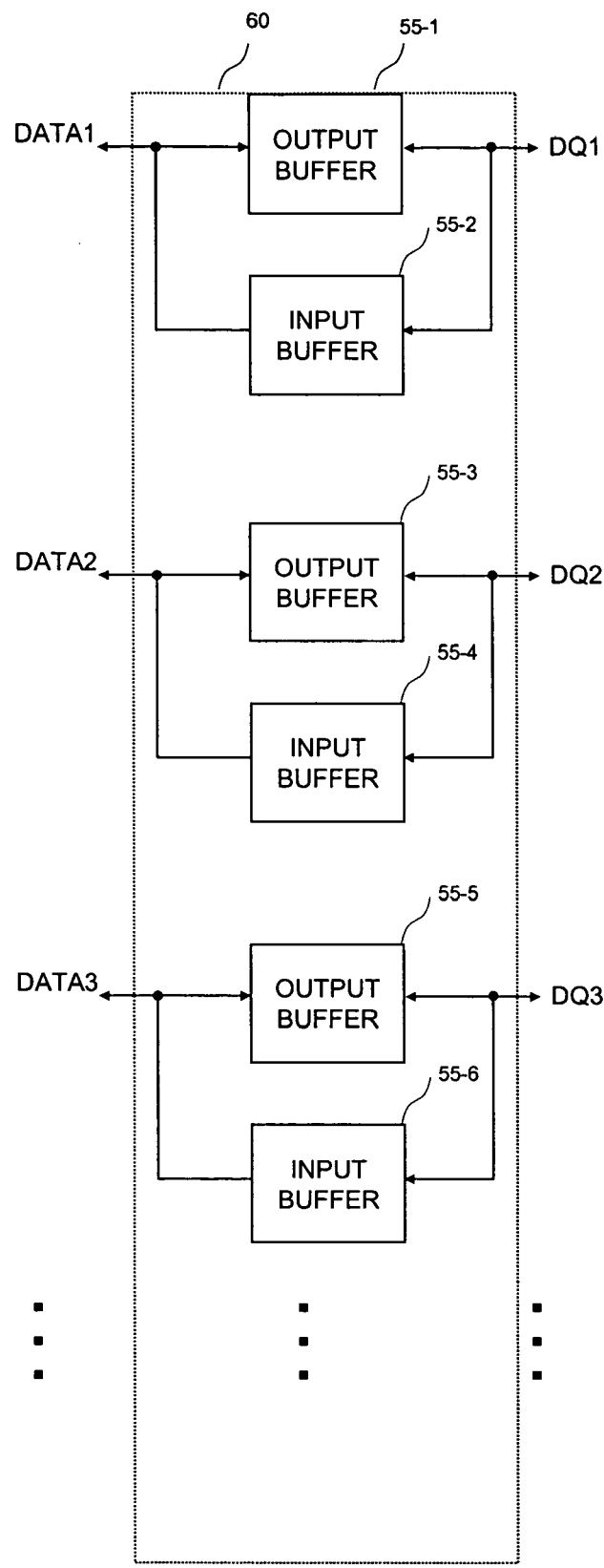
FIG. 2 is a block diagram of the I/O interface circuit of the conventional memory device of FIG. 1.
Figure 5:
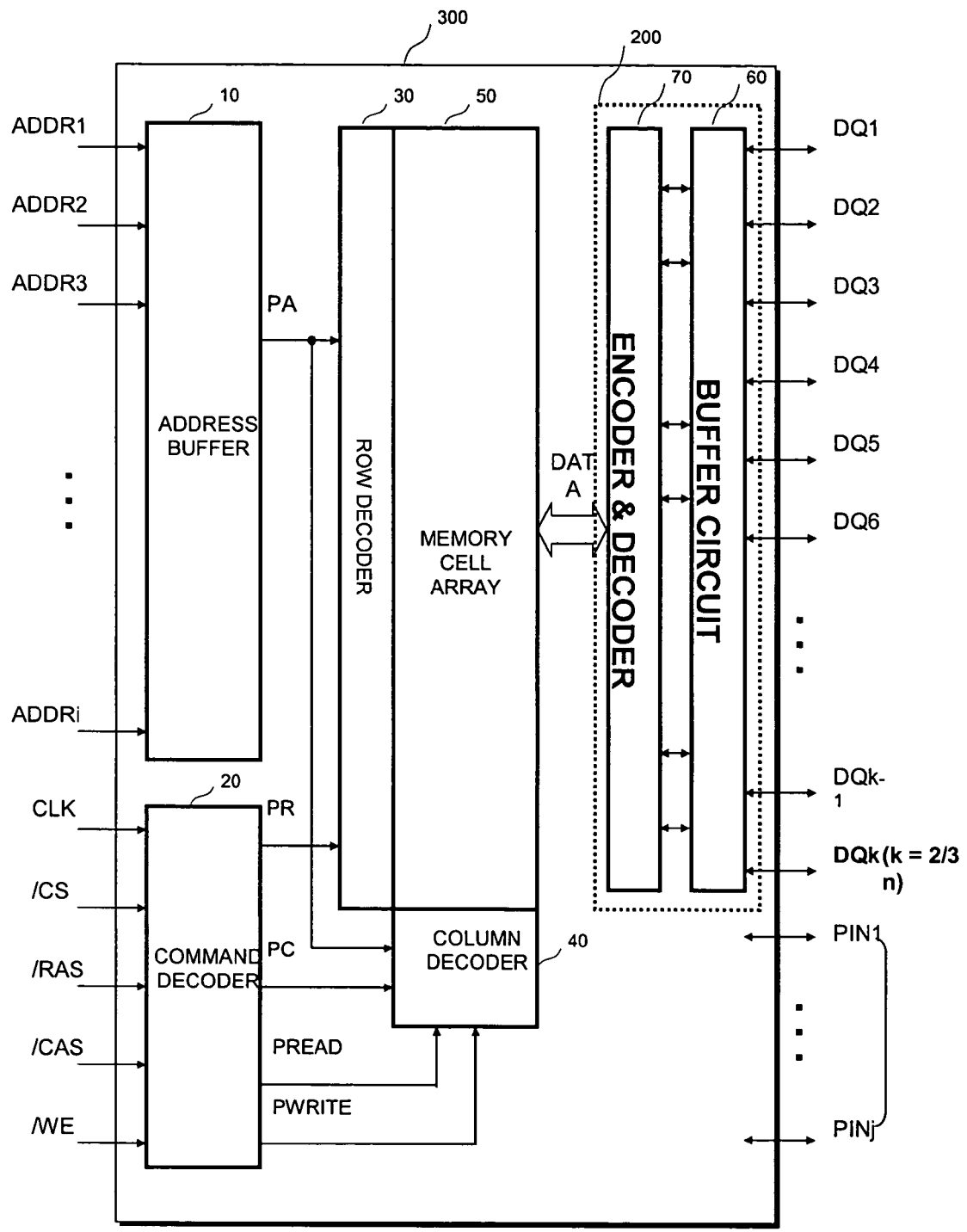
FIG. 5 is a block diagram of a memory device including the I/O interface of FIG. 4 according to an embodiment of the present invention.

Reference is now made to FIG. 5 which is a block diagram of a memory device which employs the I/O interface circuit of an embodiment of the present invention. The address buffer 10, the command decoder 20, the row decoder 30, the column decoder 40 and the memory cell array 50 all operate in the same manner as in the conventional device of FIG. 1. Accordingly, to avoid duplication in the description, reference is simply made the previous explanation of these components.

In the memory device of FIG. 5, the I/O interface of the invention is interposed between the memory cell array and data pin terminals DQ1 through DQk. As describe above in connection with FIG. 6, the I/O interface 200 of one embodiment includes an encoder/decoder circuit 70 and an input/output buffer circuit 60. In this example, during a read operation, data (DATA) in the form of an n-bit parallel binary output signal is transmitted from the memory cell array 50 to the I/O interface circuit 200. Each three bits of the n-bit output signal is encoded into two ternary signals which are applied to two of the data pins DQ1 through DQk. Thus, the number of data pins k is equal to two-thirds of the number of output bits n from the memory cell array 50. It can therefore be seen that one-third fewer data pins are needed when compared to the conventional arrangement. These unneeded data pins are designated as pins PIN1 through PINj in FIG. 6, and are available for other applications.

Figure 8:
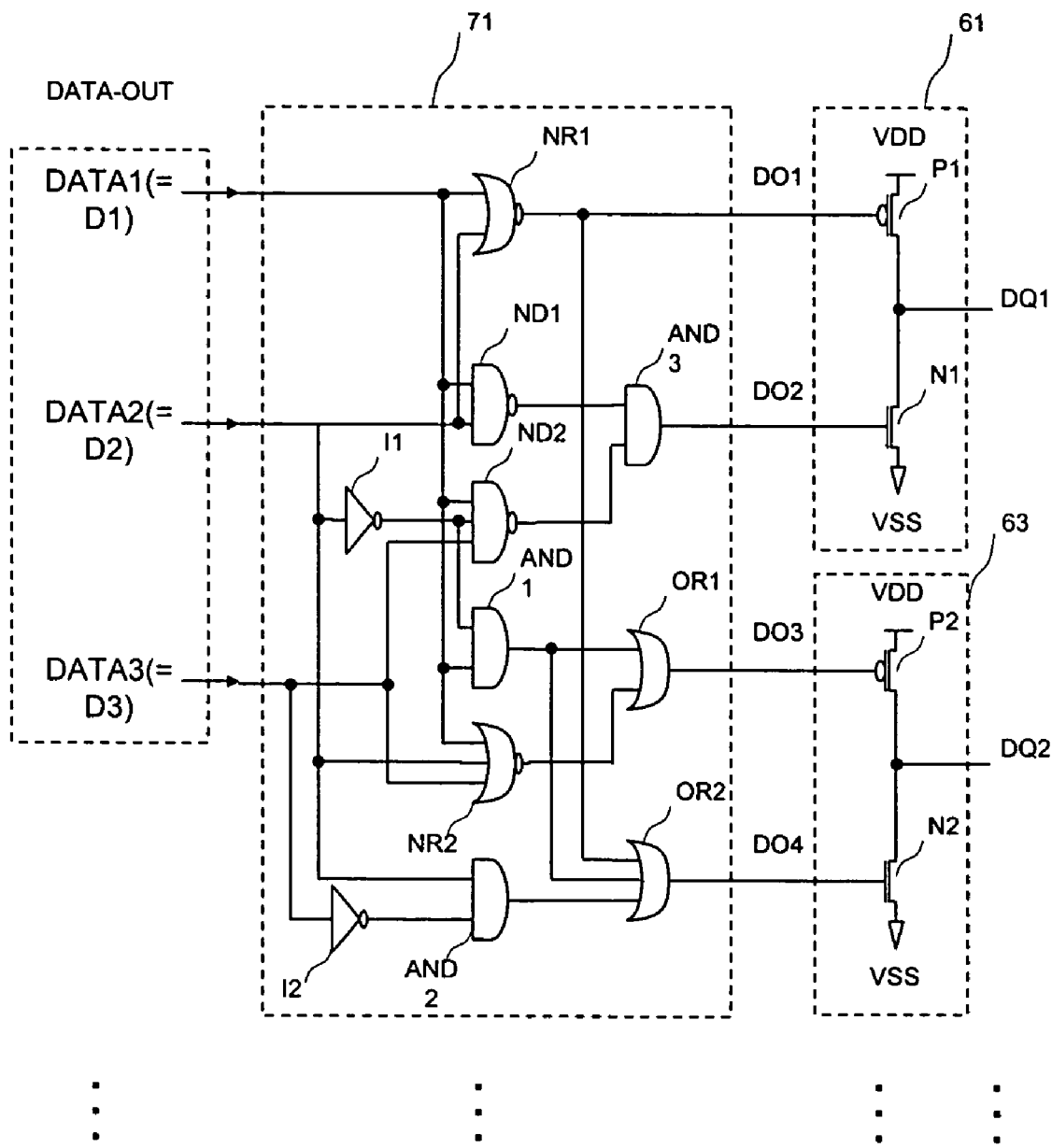
FIG. 8 is a schematic diagram of an encoder and output buffer according to an embodiment of the present invention.

FIG. 8 illustrates detailed examples of the encoder 71 and output buffers 61 and 63 shown in FIG. 6, and FIG. 11 is a logic encoding table for explaining the operation of FIG. 8. The encoder 71 receives binary input data D1, D2 and D3, and is equipped with logic circuits to encode the binary input data as binary encoded data DO1, DO2, DO3 and DO4. In this particular example, the encoder 71 includes "nor" gates NR1 and NR2, "nand" gates ND1 and ND2, "and" gates AND1 through AND3, "or" gates OR1 and OR2, and inverters I1 and I2, all connected as shown in FIG. 8.

The relationship between the binary input data D1, D2, D3 and the binary encoded data DO1, DO2, DO3, DO4 is shown in FIG. 11. For example, in the case where input data is "011", the encoded data becomes "0100".

The encoded data DO1 and DO2 are applied to an output buffer 61 to convert the encoded data into a ternary signal for application to terminal DQ1. In this example, the output buffer 61 is equipped with a p-type transistor P1 and an n-type transistor N1. Binary encoded signal DO1 is applied to the gate of transistor P1, and binary encoded signal DO2 is applied to the gate of transistor N1. Assuming, for the sake of simplicity, that transistors P1 and N1 are ideal transistors of the same current capability, then the output of the buffer 61 will be VSS (low) when both DO1 and DO2 are high; VDD/2 (medium) when DO1 is low and DO2 is high; and VDD (high) when both DO1 and DO2 are low. This is shown in columns DO1, DO2 and DQ1 of the table of FIG. 11, where 0 denotes low, 1 denotes high, and M denotes medium.

The buffer 63 functions in the same manner to convert binary signals DO3 and DO4 into a ternary signal for application to the terminal DQ2.

Therefore, as shown the table of FIG. 11, the encoder 71 and output buffers 61, 63 operate to encode the binary output data D1, D2, D3 into ternary output data applied to terminals DQ1 and DQ2. For example, in the case where the binary output data is "011", the ternary encoded output data is "M1".

Figure 9:
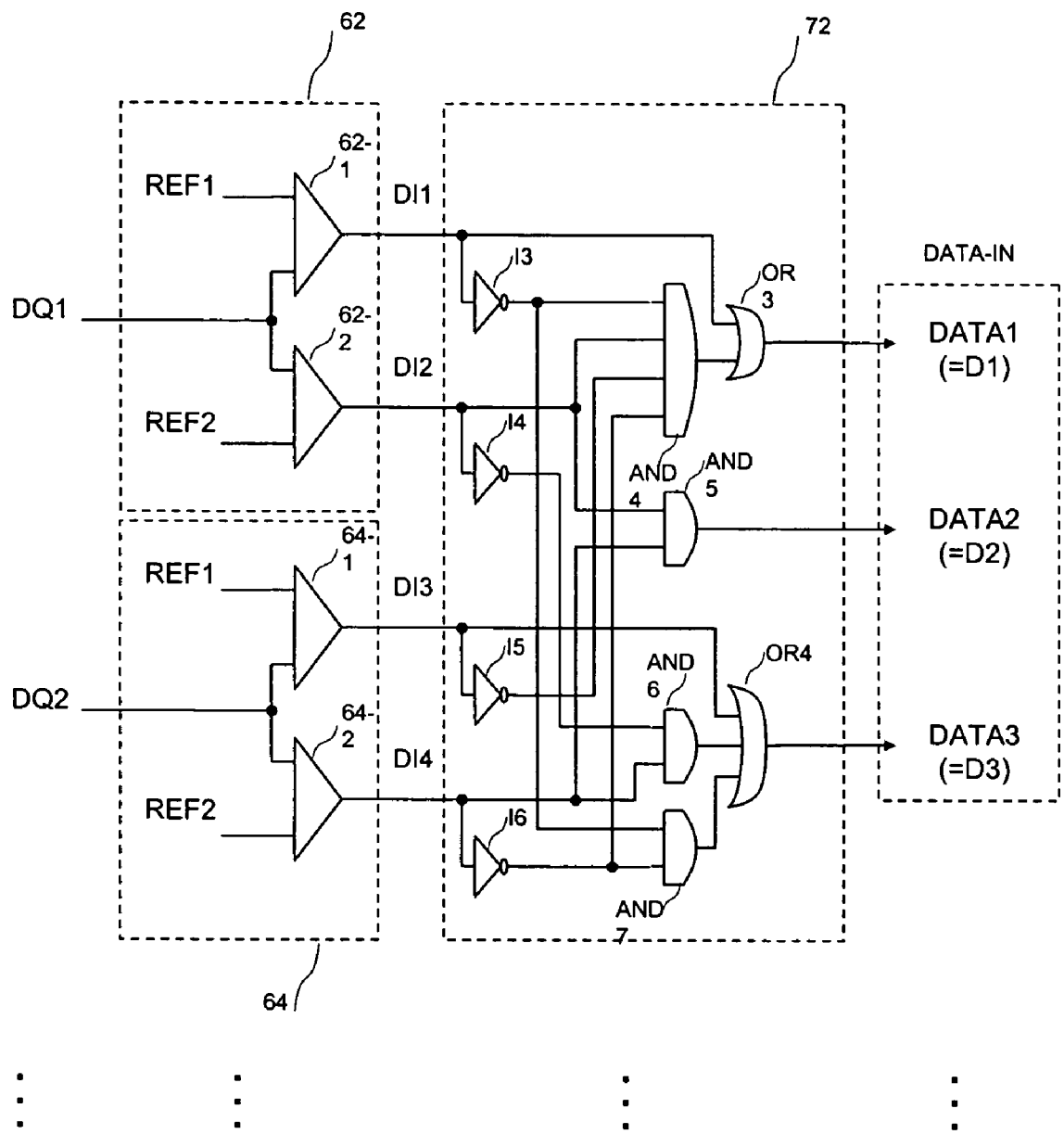
FIG. 9 is a schematic diagram of an input buffer and decoder according to an embodiment of the present invention.

FIG. 9 illustrates detailed examples of the input buffers 62 and 64 shown in FIG. 6, and FIG. 12 is a logic decoding table for explaining the operation of FIG. 9. As shown, input buffer 62 is equipped with first and second comparators 62-1 and 62-2 which compare the ternary signal received on terminal DQ1 with first and second reference voltages REF1 and REF2, and which output the comparison results as binary coded data DI1 and DI2. In this example, as shown in FIG. 12, if the ternary signal is "0", then both DI1 and DI2 are "0"; if the ternary signal is "M", then DI1 is "0" and DI2 is "1"; and if the ternary signal is "1", then both DI1 and DI2 are "1".

The second input buffer 64 is similarly equipped with comparators 64-1 and 64-2, and outputs binary coded data DI3 and DI4 based on the ternary signal of terminal DQ2.

The decoder 72 receives the binary coded data DI1, DI2, DI3 and DI4, and is equipped with logic circuits to decode the binary coded data as binary decoded data D1, D2 and D3. In this particular example, the decoder 72 includes "and" gates AND4 through AND7, "or" gates OR3 and OR4, and inverters I3 through I6, all connected as shown in FIG. 9.

The relationship between the binary coded data DI1, DI2, DI3, DI4 and the binary decoded data D1, D2, D3 is shown in FIG. 12. For example, in the case where coded data is "0100", the decoded data becomes "100".

Therefore, as shown the table of FIG. 12, the input buffers 62, 64 and decoder 72 operate to decode the ternary input data applied to terminals DQ1 and DQ2 into binary input data D1, D2, D3. For example, in the case where the ternary encoded input data is "M1", the binary input data is "011".

Figure 10:
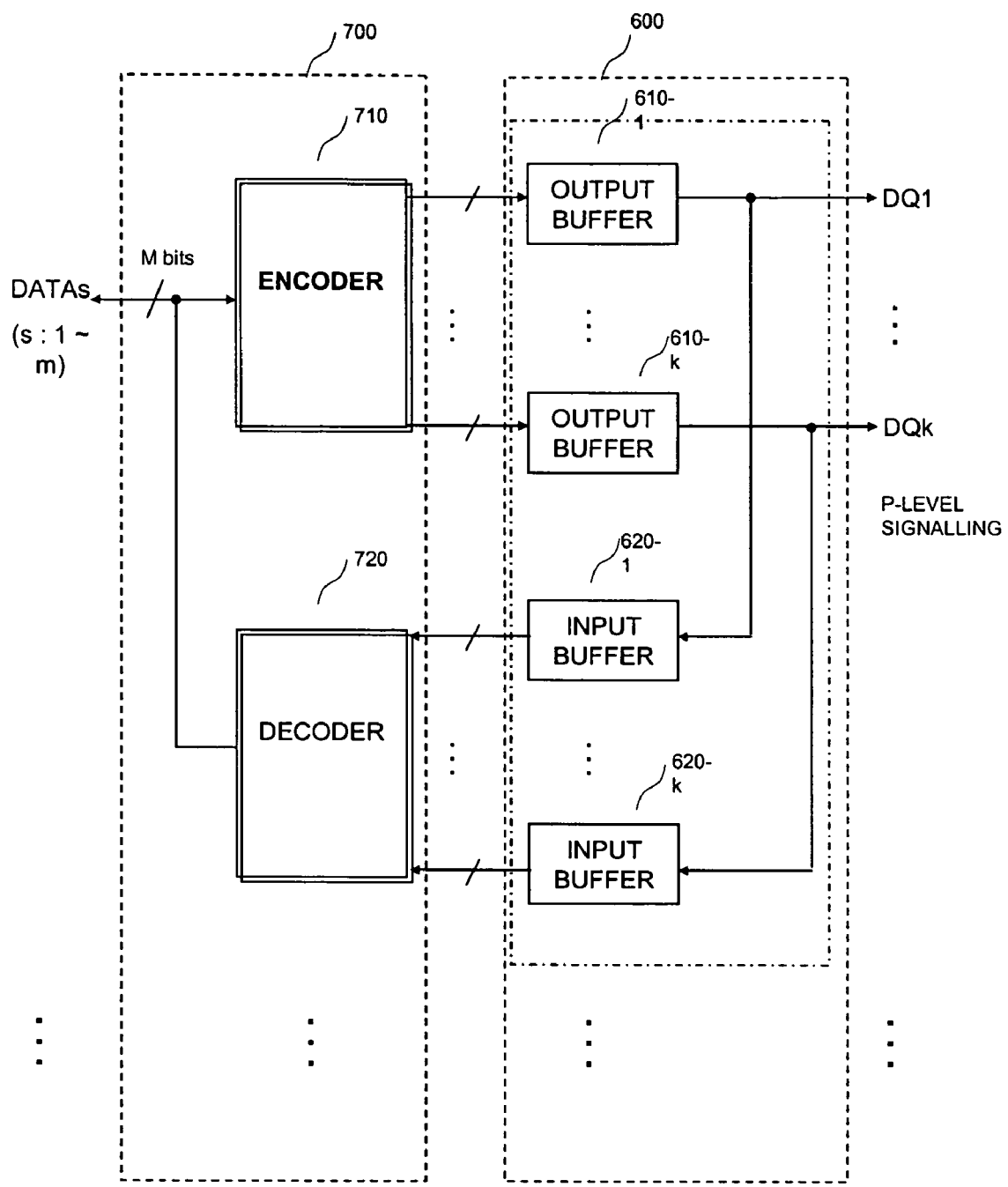
FIG. 10 is a block diagram of an I/O interface according to an embodiment of the present invention.

FIG. 10 is another block diagram of an I/O interface according to an embodiment of the present invention. This diagram differs from that of FIG. 6 in that it conceptually shows an arrangement having multiple output terminals DQ1 through DQk, and in that it is not necessarily directed to a binary-to-ternary conversion. In an output operation, M bits of binary output data are received by the I/O interface having the encoder/decoder circuit 700 and buffer circuit 600. The encoder 710 and output buffers 610-1 through 610-k encode the binary output data as base-P-level output signals (where $P^K \geq 2^M$) and apply these signals to the terminals DQ1 through DQk, respectively. In an input operation, base-P-level input signals of terminals DQ1 through DQk are decoded by input buffers 620-1 through 620-k and decoder 720 into M bits of binary input data. Note that in the case of K terminals DQ1 through DQk, K sets of input/output buffer would be provided.

In the drawings and specification, there have been disclosed typical preferred embodiments of this invention and, although specific examples are set forth, they are used in a generic and descriptive sense only and not for purposes of limitation. For example, the invention is not limited to the binary-to-ternary conversion primarily described herein.

Further, referring to FIG. 5, the I/O interface of the embodiments of the invention may be interposed between the command decoder 20 and command pin terminals of the memory device 300, and/or between the address buffer 10 and address pin terminals.

It should therefore be understood the scope of the present invention is to be construed by the appended claims, and not by the exemplary embodiments.

What is claimed is:

1. A method of interfacing an internal circuit of an integrated circuit device with input/output terminals of the integrated circuit device, said method comprising:
   a first signal conversion process which comprises:
      receiving M base-A-level output signals from M terminals of the internal circuit, respectively;
      encoding each of $A^M$ values represented by the M base-A-level output signals as a different base-K value represented by N base-K-level output signals, and
      outputting the N base-K-level output signals to N input/output terminals of the integrated circuit device, respectively; and
   a second signal conversion process which comprises:
      receiving N base-K-level input signals from the N input/output terminals of the integrated circuit device, respectively,
      decoding each base-K value represented by the N base-K-level input signals into a different one of $A^M$ values of M base-A-level input signals, and
      outputting the M base-A-level input signals to the M terminals of the internal circuit, respectively;
   wherein M, N, A and K are positive integers, wherein M>N>1 and K>A>1, and wherein the integrated circuit device includes a memory cell array, and a command decoder and an address buffer coupled to the memory cell array, wherein the internal circuit is at least one of the memory cell array, the command decoder, and the address buffer, and wherein the N input/output terminals are at least one of data pin terminals, command pin terminals and address pin terminals.

2. An integrated circuit, comprising:
   M first terminals and N second terminals, where M and N are positive integers, and where M>N>1:
   a converter which receives M base-A-level input signals from the M first tenninals, respectively, which encodes each of $A^M$ values represented by the M base-A-level input signals as a different base-K value represented by N base-K-level output signals, and which outputs the N base-K-level output signals to the N second terminals, respectively, where A and K are positive integers, and where K>A>1, wherein the N terminals are pin terminals.

3. The integrated circuit of claim 2, further comprising a memory cell array, wherein the M terminals are coupled to the memory cell array, and wherein the N terminals are data pin terminals.

4. The integrated circuit of claim 2, further comprising a memory cell array and an address decoder coupled to the memory cell array, wherein the M terminals are coupled to the address decoder, and wherein the N pin terminals are address pin terminals.

5. The integrated circuit of claim 2, further comprising a memory cell array and a command decoder coupled to the memory cell array, wherein the M terminals are coupled to the command decoder, and wherein the N terminals are command pin terminals.

6. The integrated circuit of claim 1 wherein A =2.

7. The integrated circuit of claim 6, wherein M=3, N=2 and K=3.

8. An integrated circuit, comprising:
M first terminals and N second terminals, where M and N are positive integers, and where M>N>1:
a converter which receives M base-A-level input signals from the M first terminals, respectively, which encodes each of $A^M$ values represented by the M base-A-level input signals as a different base-K value represented by N base-K-level output signals, and which outputs the N base-K-level output signals to the N second terminals, respectively, where A and K are positive integers, and where K>A>1; and
a memory cell array, and a command decoder and an address buffer coupled to the memory cell array, wherein the M terminals are coupled to at least one of the memory cell array, the command decoder, and the address buffer, and wherein the N terminals are at least one of data pin terminals, command pin terminals and address pin terminals.

9. The integrated circuit of claim 8, wherein the converter comprises:
an encoder which receives the M base-A-level input signals and which outputs at least M+1 encoded signals; and
an output buffer which receives the at least M+1 encoded signals and outputs the N base-K-level output signals.

10. The integrated circuit of claim 9, wherein A=2, M=3, N=2 and K=3.

11. An integrated circuit, comprising:
N first terminals and M second terminals, where M and N are positive integers, and where M>N>1:
a converter which receives N base-K-level input signals from the N first terminals, respectively, which decodes each base-K value represented by the N base-K-level input signals into a different one of $A^M$ values of M base-A-level output signals, and which outputs the M base-A-level output signals to the M second terminals, respectively, where A and K are positive integers, and where K>A>1, wherein the N terminals are pin terminals.

12. The integrated circuit of claim 11, further comprising a memory cell array, wherein the M terminals are coupled to the memory cell array, and wherein the N terminals are data pin terminals.

13. The integrated circuit of claim 11, further comprising a memory cell array and an address decoder coupled to the memory cell array, wherein the M terminals are coupled to the address decoder, and wherein the N pin terminals are address pin terminals.

14. The integrated circuit of claim 11, further comprising a memory cell array and command decoder coupled to the memory cell array, wherein the M terminals are coupled to the command decoder, and wherein the N terminals are command pin terminals.

15. An integrated circuit, comprising:
N first terminals and M second terminals, where M and N are positive integers, and where M>N>1:
a converter which receives N base-K-level input signals from the N first terminals, respectively, which decodes each base-K value represented by the N base-K-level input signals into a different one of $A^M$ values of M base-A-level output signals, and which outputs the M base-A-level output signals to the M second terminals, respectively, where A and K are positive integers, and where K>A>1; and
a memory cell array, and a command decoder and an address buffer coupled to the memory cell array, wherein the M terminals are coupled to at least one of the memory cell array, the command decoder, and the address buffer, and wherein the N terminals are at least one of data pin terminals, command pin terminals and address pin terminals.

16. The integrated circuit of claim 15, wherein A=2.

17. The integrated circuit of claim 16, wherein M=3, N=2 and K=3.

18. The integrated circuit of claim 15, wherein the converter comprises:
an input buffer which receives the N base-K-level input signals and which outputs at least M+1 coded signals; and
an decoder which receives the at least M+1 coded signals and which outputs the M base-A-level output signals.

19. The integrated circuit of claim 18, wherein A=2, M=3, N=2 and K=3.

20. An integrated circuit, comprising:
M first terminals and N second terminals, where M and N are positive integers, and where M>N>1:
a first converter which receives M base-A-level output signals from the M first terminals, respectively, which encodes each of $A^M$ values of the M base-A-level output signals into a different base-K value represented by N base-K-level output signals, and which outputs the N base-K-level output signals to the N second terminals, respectively, where A and K are positive integers, and where K>A>1; and
a second converter which receives N base-K-level input signals from the N first terminals, respectively, which decodes each base-K value represented by the N base-K-level input signals into a different one of $A^M$ values of M base-A-level input signals. and which outputs the M base-A-level input signals to the M second terminals, respectively, wherein the N terminals are pin terminals.

21. The integrated circuit of claim 20, further comprising a memory cell array, wherein the M terminals are coupled to the memory cell array, and wherein the N terminals are data pin terminals.

22. The integrated circuit of claim 20, further comprising a memory cell array and an address decoder coupled to the memory cell array, wherein the M terminals are coupled to the address decoder, and wherein the N pin terminals are address pin terminals.

23. The integrated circuit of claim 20, further comprising a memory cell array and command decoder coupled to the memory cell array, wherein the M terminals are coupled to the command decoder, and wherein the N terminals are command pin terminals.

24. An integrated circuit, comprising:
M first terminals and N second terminals, where M and N are positive integers, and where M>N>1:
a first converter which receives M base-A-level output signals from the M first terminals, respectively, which encodes each of $A^M$ values of the M base-A-level outnut signals into a different base-K value represented by N base-K-level output signals. and which outputs the N base-K-level output signals to the N second terminals, respectively, where A and K are positive integers, and where K>A>1; and
a second converter which receives N base-K-level input signals from the N first terminals, respectively, which decodes each base-K value represented by the N base-K-level input signals into a different one of $A^M$ values of M base-A-level input signals, and which outputs the M base-A-level input signals to the M second terminals, respectively; and a memory cell array, and a command decoder and an address buffer coupled to the memory cell array, wherein the M terminals are coupled to at least one of the memory cell array, the command decoder, and the address buffer, and wherein the N terminals are coupled to at least one of data pin terminals, command pin terminals and address pin terminals.

25. The integrated circuit of claim 24, wherein A=2.

26. The integrated circuit of claim 25, wherein M=3, N=2 and K=3.

27. The integrated circuit of claim 24, wherein the first converter comprises (a) an encoder which receives the M base-A-level output signals and which outputs at least M+1 encoded signals, and (b) an output buffer which receives the at least M+1 encoded signals and outputs the N base-K-level output signals; and wherein the second converter comprises (a) an input buffer which receives the N base-K-level input signals and which outputs at least M+1 coded signals, and (b) an a decoder which receives the at least M+1 coded signals and which outputs the M base-A-level input signals.

28. The integrated circuit of claim 27, wherein A=2, M=3, N=2 and K=3.

29. An integrated circuit comprising:
a memory device including an memory cell array, an address decoder and a command decoder;
a plurality of pin terminals; and
an interface circuit operatively coupled between the memory device and the plurality of pin terminals, said interface circuit comprising (a) a first converter which receives three binary-level output signals from three respective signal lines of the memory device, which encodes each of eight values represented by the three binary-level output signals into a ternary value represented by two ternary-level output signals, and which outputs the two ternary-level output signals to two of said plurality of pin terminals, respectively, and (b) a second converter which receives two ternary-level input signals from said two pin terminals, respectively, which decodes each ternary value represented by the two ternary-level input signals into a different one of eight values represented by three binary-level input signals, and which outputs the three binary-level input signals to said three signal lines of the memory device, respectively.

30. The integrated circuit of claim 29, wherein the interface circuit is coupled between the memory cell array and the pin terminals, and wherein the pin terminals are data pin terminals.

31. The integrated circuit of claim 29, wherein the interface circuit is coupled between the address decoder and the pin terminals, and wherein the pin terminals are address pin terminals.

32. The integrated circuit of claim 29, wherein the interface circuit is coupled between the command decoder and the pin terminals, and wherein the pin terminals are command pin terminals.

33. The integrated circuit of claim 29, wherein the first converter comprises (a) an encoder which receives the three binary-level output signals and which outputs at least four encoded signals, and (b) an output buffer which receives the at least four encoded signals and outputs the two ternary-level output signals; and wherein the second converter comprises (a) an input buffer which receives the two ternary-level input signals and which outputs at least four coded signals, and (b) an decoder which receives the at least four coded signals and which outputs the three binary-level input signals.

34. A method of interfacing an internal circuit of an integrated circuit device with output terminals of the integrated circuit device, said method comprising:
receiving M base-A-level output signals from M terminals of the internal circuit, respectively:
encoding each of $A^M$ values represented by the M base-A-level output signals as a different base-K value represented by N base-K-level output signals; and
outputting the N base-K-level output signals to N output terminals of the integrated circuit device, respectively, wherein M, N, A and K are positive integers, wherein M>N>1, wherein K>A>1, and wherein the N output terminals are pin terminals of the integrated circuit device.

35. The method of claim 34, wherein the internal circuit of the integrated circuit device is a memory cell array, and wherein the N output terminals are data pin terminals.

36. A method of interfacing an internal circuit of an integrated circuit device with output terminals of the integrated circuit device, said method comprising:
receiving M base-A-level output signals from M terminals of the internal circuit, respectively;
encoding each of $A^M$ values represented by the M base-A-level output signals as a different base-K value represented by N base-K-level output signals; and
outputting the N base-K-level output signals to N output terminals of the integrated circuit device, respectively, wherein M, N, A and K are positive integers, wherein M>N>1, wherein K>A>1 and wherein the integrated circuit includes a memory cell array, and a command decoder and an address buffer coupled to the memory cell array, wherein the internal circuit is at least one of the memory cell array, the command decoder, and the address buffer, and wherein the N output terminals are at least one of data pin terminals, command pin terminals and address pin terminals.

37. A method of interfacing an internal circuit of an integrated circuit device with input terminals of the integrated circuit device, said method comprising:
receiving N base-K-level input signals from N input terminals of the integrated circuit device, respectively;
decoding each base-K value represented by the N base-K-level input signals into a different one of $A^M$ values of M base-A-level input signals; and
outputting the M base-A-level input signals to M terminals of the internal circuit, respectively, wherein M, N, A and K are positive integers. wherein M>N>1, and wherein K>A>1 and wherein the N input terminals are pin terminals of the integrated circuit device.

38. The method of claim 37, wherein the internal circuit of the integrated circuit device is a memory cell array, and wherein the N input terminals are data pin terminals.

39. A method of interfacing an internal circuit of an integrated circuit device with input terminals of the integrated circuit device, said method comprising:
receiving N base-K-level input signals from N input terminals of the integrated circuit device, respectively;
decoding each base-K value represented by the N base-K-level input signals into a different one of $A^M$ values of M base-A-level input signals; and outputting the M base-A-level input signals to M terminals of the internal circuit, respectively, wherein M, N, A and K are positive integers, wherein M>N>1, and wherein K>A>1 and wherein the integrated circuit device includes a memory cell array, and a command decoder and an address buffer coupled to the memory cell array, wherein the internal circuit is at least one of the memory cell array, the command decoder, and the address buffer, and wherein the N input terminals are at least one of data pin terminals, command pin terminals and address pin terminals.

40. A method of interfacing an internal circuit of an integrated circuit device with input/output terminals of the integrated circuit device, said method comprising:

a first signal conversion process which comprises:
receiving M base-A-level output signals from M terminals of the internal circuit, respectively;
encoding each of $A^M$ values represented by the M base-A-level output signals as a different base-K value represented by N base-K-level output signals, and outputting the N base-K-level output signals to N input/output terminals of the integrated circuit device, respectively; and a second signal conversion process which comprises:
receiving N base-K-level input signals from the N input/output terminals of the integrated circuit device, respectively.
decoding each base-K value represented by the N base-K-level input signals into a different one of $A^M$ values of M base-A-level input signals, and
outputting the M base-A-level input signals to the M terminals of the internal circuit, respectively;

wherein M, N, A and K are positive integers, wherein M>N>1 wherein K>A>1, and wherein the N input/output terminals are pin terminals of the integrated circuit device.

41. The method of claim 40, wherein the internal circuit of the integrated circuit device is a memory cell array, and wherein the N input/output terminals are data pin terminals.

* * * * *